(12) United States Patent
Xiang et al.

(10) Patent No.: US 12,575,071 B2
(45) Date of Patent: Mar. 10, 2026

(54) COMPUTING APPARATUS AND VEHICLE

(71) Applicant: Shenzhen Yinwang Intelligent Technologies Co., Ltd., Shenzhen (CN)

(72) Inventors: Nengwu Xiang, Shenzhen (CN);
Xiaolin Jia, Hangzhou (CN);
Shuncheng Pan, Hangzhou (CN);
Pinqiang Liu, Hangzhou (CN);
Jianqiang Yin, Hangzhou (CN)

(73) Assignee: Shenzhen Yinwang Intelligent Technologies Co., Ltd., Shenzhen (CN)

( * ) Notice: Subject to any disclaimer, the term of this patent is extended or adjusted under 35 U.S.C. 154(b) by 276 days.

(21) Appl. No.: 18/169,888

(22) Filed: Feb. 16, 2023

(65) Prior Publication Data

US 2023/0200028 A1 Jun. 22, 2023

Related U.S. Application Data

(63) Continuation of application No. PCT/CN2021/106157, filed on Jul. 14, 2021.

(30) Foreign Application Priority Data

Aug. 31, 2020 (CN) .......................... 202010899465.0

(51) Int. Cl.
*H05K 7/20* (2006.01)

(52) U.S. Cl.
CPC ..... *H05K 7/20854* (2013.01); *H05K 7/20254* (2013.01); *H05K 7/20454* (2013.01); *H05K 7/20863* (2013.01); *H05K 7/20872* (2013.01)

(58) Field of Classification Search
CPC ........... H05K 7/20854; H05K 7/20254; H05K 7/20454; H05K 7/20863; H05K 7/20872; H05K 1/0207
USPC ....................................................... 361/702
See application file for complete search history.

(56) References Cited

U.S. PATENT DOCUMENTS

| | | | |
|---|---|---|---|
| 7,948,758 B2 * | 5/2011 | Buhler | H01L 23/3735 |
| | | | 361/689 |
| 10,254,793 B1 * | 4/2019 | Schnell | G06F 1/203 |
| 2005/0190539 A1 * | 9/2005 | Watanabe | H05K 7/20854 |
| | | | 361/704 |
| 2008/0158818 A1 | 7/2008 | Clidaras et al. | |
| 2012/0281364 A1 * | 11/2012 | Gunderson | H05K 5/0269 |
| | | | 361/714 |

(Continued)

FOREIGN PATENT DOCUMENTS

| | | | | |
|---|---|---|---|---|
| CA | 3040680 A1 * | 12/2019 | ......... | H05K 7/20327 |
| CN | 201584970 U | 9/2010 | | |

(Continued)

*Primary Examiner* — Mandeep S Buttar
*Assistant Examiner* — Kyle Oxenknecht
(74) *Attorney, Agent, or Firm* — Leydig, Voit & Mayer, Ltd.

(57) ABSTRACT

An in-vehicle computing apparatus comprises a mainboard, a heat dissipation component, and a target printed circuit board (PCB). A system on chip (SOC) and a connection component are disposed on the target PCB. A side of the mainboard is attached to the heat dissipation component. The target PCB is located on a side of the heat dissipation component that faces away from the mainboard, and is detachably connected to the heat dissipation component by using the connection component.

20 Claims, 9 Drawing Sheets

(56)                    References Cited

U.S. PATENT DOCUMENTS

| | | | | | |
|---|---|---|---|---|---|
| 2017/0303431 | A1 * | 10/2017 | Kim | ..................... | H01L 23/147 |
| 2018/0352666 | A1 * | 12/2018 | Liskow | ................. | H05K 3/368 |
| 2019/0227538 | A1 * | 7/2019 | Lassini | ................ | G06F 9/4401 |

FOREIGN PATENT DOCUMENTS

| | | | | | |
|---|---|---|---|---|---|
| CN | 206294475 | U | | 6/2017 | |
| CN | 107031328 | A | | 8/2017 | |
| CN | 109413958 | A | | 3/2019 | |
| CN | 208569515 | U | * | 3/2019 | |
| CN | 209191830 | U | | 8/2019 | |
| CN | 110440621 | A | | 11/2019 | |
| CN | 210093821 | U | | 2/2020 | |
| CN | 111198601 | A | | 5/2020 | |
| CN | 210630173 | U | | 5/2020 | |
| CN | 210986748 | U | * | 7/2020 | |
| JP | H11329 | A | * | 1/1999 | .......... G01S 15/899 |
| JP | 2014175539 | A | | 9/2014 | |
| WO | WO-2014136157 | A1 | * | 9/2014 | .......... H05K 5/0004 |

* cited by examiner

201

203

216

212

201

COMPUTING APPARATUS AND VEHICLE

CROSS-REFERENCE TO RELATED APPLICATIONS

This application is a continuation of International Application PCT/CN2021/106157, filed on Jul. 14, 2021, which claims priority to Chinese Patent Application No. 202010899465.0, filed on Aug. 31, 2020. The disclosures of the aforementioned priority applications are hereby incorporated by reference in their entirety.

TECHNICAL FIELD

This application relates to the field of hardware structure technologies, and in particular, to a computing apparatus and a vehicle.

BACKGROUND

Automated driving is a key technology for implementing intelligent vehicles and intelligent transportation, and is also an inevitable trend of future vehicle development. From the perspective of industry development, automated driving, through integration with the Internet of Things, cloud computing, and artificial intelligence (AI), will become an important engine for future development of many industries, driving the rapid development of intelligent manufacturing and next-generation information technologies.

A computing apparatus is the brain of an entire automated driving system. As the level of automated driving continues to improve, a requirement for computing power of an in-vehicle computing apparatus continuously increases. As a result, power consumption of components on a mainboard increases, and an increasing quantity of components are disposed on the mainboard.

A current in-vehicle computing apparatus includes the mainboard. In an existing implementation, all components (including a system on chip (SOC)) in the computing apparatus are disposed on one mainboard. As an increasing quantity of components need to be included in the computing apparatus, a required area of a mainboard continuously increases. As a result, a size and a weight of a computing module increase, and different system mainboards need to be developed for computing apparatuses that require different computing power and different driving levels.

SUMMARY

In this application, there is no need to develop different system mainboards, and only a target PCB on which a required SOC is disposed needs to be selected and detachably installed on a heat dissipation component. On a premise that a system mainboard remains unchanged, only a target PCB on which a SOC of a different type or supplier is disposed needs to be replaced.

According to a first aspect, this application provides an in-vehicle computing apparatus, including a mainboard, a heat dissipation component, and a target printed circuit board (PCB). A system on chip SOC and a connection component are disposed on the target PCB, one side of the mainboard is attached to the heat dissipation component, and the target PCB is located on a side that is of the heat dissipation component and that faces away from the mainboard, and is detachably connected to the heat dissipation component by using the connection component.

The mainboard may also be referred to as a system mainboard. The mainboard may be a rectangular circuit board, and a capacitor, a resistor, an inductor, a diode, a triode, a SOC, a peripheral circuit, or the like may be disposed on the mainboard.

In this embodiment, the SOC originally located on the mainboard is disposed on another PCB (referred to as the target PCB in this embodiment) independent of the mainboard. Specifically, in this embodiment of this application, the computing apparatus may include a target PCB 202. The target PCB 202 and the mainboard 203 are two independent PCBs, and a SOC 205 and a connection component 206 may be disposed on the target PCB 202. In addition, the target PCB 202 may be detachably connected to a heat dissipation component 201 in the computing apparatus by using the connection component 206. If different SOCs need to be configured in the computing apparatus, there is no need to develop different system mainboards, and only a target PCB on which a required SOC is disposed needs to be selected and detachably installed on the heat dissipation component. On a premise that a system mainboard remains unchanged, only a target PCB on which a SOC of a different type or supplier is disposed needs to be replaced.

In addition, in an existing implementation, because a large quantity of components need to be disposed on the mainboard, the mainboard has a large area. Because the mainboard is usually rectangular plate-shaped, on a plane on which the mainboard is located, the existing mainboard occupies a large area. In this embodiment, the SOC is disposed on another target PCB independent of the mainboard, and the heat dissipation component is disposed between the mainboard and the target PCB 202. This is equivalent to disposing a part of the mainboard perpendicular to space in which the mainboard is located. In this manner, space occupied by the computing apparatus on the plane on which the mainboard is located is reduced.

In a possible implementation, a projection of the target PCB 202 along a normal direction of the plane on which the mainboard 203 is located partially or completely overlaps an area in which the mainboard 203 is located.

In a possible implementation, the projection of the target PCB along the normal direction of the plane on which the mainboard is located is in the area in which the mainboard is located.

In this embodiment of this application, the target PCB 202 including the SOC 205 is independently disposed. According to an arrangement rule of the target PCB 202, if the target PCB 202 is disposed on a same plane as the mainboard 203, areas occupied by the target PCB 202 and the mainboard 203 on the plane on which the mainboard 203 is located do not change greatly from an area occupied by the existing mainboard 203. If the target PCB 202 and the mainboard 203 are disposed on different planes, and a projection of the mainboard 203 along the normal direction of the plane on which the mainboard 203 is located partially or completely overlaps an area in which the target PCB 202 is located, in a direction of the plane on which the mainboard 203 is located, the areas occupied by the target PCB 202 and the mainboard 203 are less than the area occupied by the existing mainboard 203, that is, the target PCB 202 is arranged by using a size in a height direction (perpendicular to the plane on which the mainboard is located) inside the computing apparatus. Further, a projection of the target PCB 202 along the normal direction of the plane on which the mainboard 203 is located is in the area in which the mainboard 203 is located, so that an area occupied by the mainboard 203 along the normal direction of the plane on which the mainboard 203 is located is minimized. In a possible implementation, an included angle between the plane on which the mainboard is located and a plane on which the target PCB is located is less than a preset value. The mainboard and the target PCB are disposed in close parallel, so that occupied space along a direction perpendicular to the mainboard can be reduced.

In a possible implementation, a surface that is of the target PCB and on which the SOC is disposed faces the heat dissipation component. In this embodiment, the surface that is of the target PCB and on which the SOC is disposed faces the heat dissipation component, so that heat generated by the SOC can be transferred to the heat dissipation component.

In a possible implementation, a first temperature equalizing plate is disposed between the SOC and the heat dissipation component. In this embodiment of this application, the first temperature equalizing plate is disposed between the SOC and the heat dissipation component, and heat emitted by the SOC may be transferred to the first temperature equalizing plate, and then transferred to the heat dissipation component by using the first temperature equalizing plate. This is equivalent to expanding a heat dissipation area of the SOC by using the first temperature equalizing plate.

In a possible implementation, a thermal conductive material is filled between the first temperature equalizing plate and the SOC. The thermal conductive material may be but is not limited to thermal conductive silicone grease, a thermal adhesive, a thermal pad, a phase-change thermal conductive material, or another thermal conductive material whose thermal conductivity coefficient is close to that of the foregoing material. The thermal conductive material is filled between the first temperature equalizing plate and the SOC, so that a heat dissipation area of the SOC can be expanded, and contact thermal resistance for heat dissipation of the SOC can be reduced.

In a possible implementation, the in-vehicle computing apparatus may further include an apparatus housing, and the mainboard 203 and/or the heat dissipation component 201 are fastened to the apparatus housing. The target PCB in this embodiment may be detachably fastened to the heat dissipation component. As a structural basis for fastening the target PCB, the heat dissipation component may be fastened to the apparatus housing of the computing device; or the heat dissipation component may be connected to the mainboard, and the mainboard is fastened to the apparatus housing of the computing device; or both the heat dissipation component and the mainboard are fastened to the apparatus housing.

In a possible implementation, a fixing plate is attached to a surface that is of the target PCB and that faces away from the heat dissipation component, and the fixing plate is fastened to the apparatus housing. The fixing plate may be used to enhance strength of the target PCB, to ensure that the target PCB is not deformed in a process of inserting or removing the target PCB.

In a possible implementation, a heat emitting device is disposed on a side that is of the mainboard and that faces away from the heat dissipation component, a second temperature equalizing plate is attached to the heat emitting device, and an edge of the second temperature equalizing plate is connected to the heat dissipation component. In an existing implementation, heat is dissipated between a backside component on the mainboard and an inner surface of a lower housing of the computing apparatus by using a thermal conductive material, and heat is mainly dissipated by natural convection between the lower housing and an external environment, which has limited heat dissipation capability. Therefore, only a low-power component can be deployed. In addition, the component runs in a high-temperature environment for long time, and a long-term reliability life of the component is low. In this embodiment, the second temperature equalizing plate is attached to the heat emitting device arranged on the back side of the mainboard, and the edge of the second temperature equalizing plate is connected to the heat dissipation component, so that heat generated by the heat emitting device can be transferred to the heat dissipation component by using the second temperature equalizing plate. The heat emitting device may be a capacitor, a resistor, an inductor, a diode, a triode, a chip, a peripheral circuit, or the like.

In a possible implementation, a thermal conductive material is filled between the heat emitting device and the second temperature equalizing plate. The thermal conductive material may be but is not limited to thermal conductive silicone grease, a thermal adhesive, a thermal pad, a phase-change thermal conductive material, or another thermal conductive material whose thermal conductivity coefficient is close to that of the foregoing material.

In a possible implementation, the heat dissipation component is a liquid cold plate, and a liquid cooling pipe is disposed in an area that is on the liquid cold plate and that faces the SOC.

In a possible implementation, the heat dissipation component is an air-cooled radiator, and the SOC is located in an air-cooled heat dissipation area of the air-cooled radiator.

In this embodiment of this application, if power consumption of the heat emitting device on the mainboard and the target PCB is high, the heat dissipation component may be a liquid cold plate; or if power consumption of the heat emitting device on the mainboard and the target PCB is low, the heat dissipation component may be an air-cooled radiator.

The mainboard, the heat dissipation component, and the target printed circuit board (PCB) are provided. The system on chip SOC and the connection component are disposed on the target PCB. A side of the mainboard is attached to the heat dissipation component. The target PCB is located on a side that is of the heat dissipation component and that faces away from the mainboard, and is detachably connected to the heat dissipation component by using the connection component.

According to a second aspect, this application provides a method for assembling an in-vehicle computing apparatus, including:

installing one side of a mainboard 203 on one side of a heat dissipation component;

fastening an edge area of a second temperature equalizing plate to the heat dissipation component, where the mainboard is located between a central area of the second temperature equalizing plate and the heat dissipation component, and a heat emitting device on the other side of the mainboard 203 is attached to the second temperature equalizing plate;

fastening a target PCB to the other side of the heat dissipation component by using a connection component; and fastening an upper cover and a bottom cover to the heat dissipation component, to seal the mainboard 203.

In a possible implementation, the method further includes:

installing a first temperature equalizing plate between the target PCB and the heat dissipation component, so that the first temperature equalizing plate is attached to the other side of the target PCB and the heat dissipation component.

In a possible implementation, the method further includes:

fastening a fixing plate on a surface that is of the target PCB and that faces away from the heat dissipation component.

According to a third aspect, this application provides a vehicle, including a vehicle body and the computing apparatus according to any one of the first aspect disposed in the vehicle body.

An embodiment of this application provides an in-vehicle computing apparatus, including a mainboard, a heat dissipation component, and a target PCB. A system on chip SOC and a connection component are disposed on the target PCB. A side of the mainboard is attached to the heat dissipation component. The target PCB is located on a side that is of the heat dissipation component and that faces away from the mainboard, and is detachably connected to the heat dissipation component by using the connection component. In this embodiment of this application, the computing apparatus may include the target PCB. The target PCB and the mainboard are two independent PCBs, and the SOC and the connection component may be disposed on the target PCB. In addition, the target PCB may be detachably connected to a fixing component in the computing apparatus by using the connection component. If different SOCs need to be configured in the computing apparatus, there is no need to develop different system mainboards, and only a target PCB on which a required SOC is disposed needs to be selected and detachably installed on the heat dissipation component. On a premise that a system mainboard remains unchanged, only a target PCB on which a SOC of a different type or supplier is disposed needs to be replaced.

DESCRIPTION OF EMBODIMENTS

Figure 1:
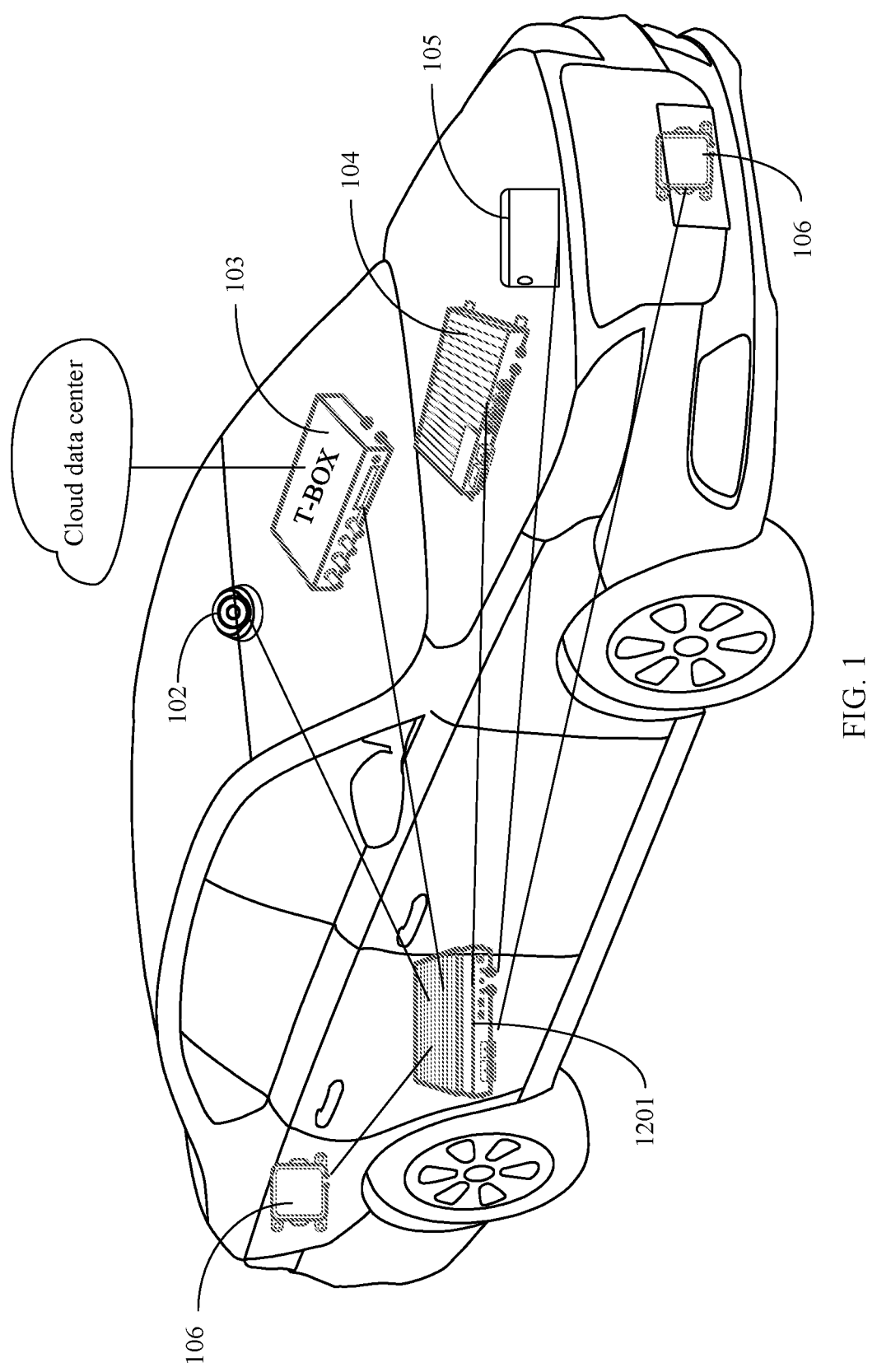
FIG. 1 is a schematic diagram of a structure of a vehicle.

The following describes embodiments of the present invention with reference to the accompanying drawings in embodiments of the present invention. Terms used in embodiments of the present invention are merely intended to explain specific embodiments of the present invention, and are not intended to limit the present invention.

The following describes embodiments of this application with reference to the accompanying drawings. A person of ordinary skill in the art may learn that, with development of technologies and emergence of a new scenario, the technical solutions provided in embodiments of this application are also applicable to a similar technical problem.

In the specification, claims, and accompanying drawings of this application, the terms "first", "second", and so on are intended to distinguish between similar objects but do not necessarily indicate a specific order or sequence. It should be understood that the terms used in such a way are interchangeable in proper circumstances, which is merely a discrimination manner that is used when objects having a same attribute are described in embodiments of this application. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, product, or device.

First, an application scenario of a computing apparatus provided in this application is described. The computing apparatus provided in this application may be an in-vehicle computing apparatus, a memory, a mobile phone, or a server. For ease of description, the following uses an example in which the computing apparatus is an in-vehicle computing apparatus (the computing apparatus in the following may be considered as an in-vehicle computing apparatus). The in-vehicle computing apparatus may be applied to automated driving of an intelligent vehicle. The intelligent vehicle includes electric vehicles or gasoline-driven vehicles that support unmanned driving, driver assistance/ADAS, intelligent driving, connected driving, intelligent network driving, and car sharing. The in-vehicle computing apparatus is configured to perform driving status control and status monitoring on the intelligent vehicle, and includes but is not limited to a mobile data center (MDC), a hardware monitor interface (HMI) that implements a function of a human-computer interaction controller, an in-vehicle infotainment (IVI) controller, a body control module BCM), and a vehicle control unit (VCU). The in-vehicle computing apparatus may be a chip having computing and processing capabilities, or a set of a plurality of components such as a processor and a memory integrated in a printed circuit board (PCB). The processor includes but is not limited to a central processing unit (CPU), a general-purpose processor, a digital signal processor (DSP), an application-specific integrated circuit (ASIC), a field-programmable gate array (FPGA) or another programmable logic device, a discrete gate or a transistor logic device, a discrete hardware component, a graphics processing unit (GPU), and an artificial intelligence (AI) chip. The general-purpose processor may be a microprocessor or any conventional processor or the like.

For example, as shown in FIG. 1, an in-vehicle computing apparatus 1201 may be installed at a proper position such as a center console or close to a vehicle liquid cooling pump. Various sensors (such as a millimeter-wave radar 106, a laser radar 105, and a camera 102) installed on the vehicle detect an environment in which the vehicle is located, and then sends sensed information regarding the environment to a chip built in the in-vehicle computing apparatus 1201 to perform a real-time inference operation. Finally, the in-vehicle computing apparatus 1201 delivers an operation command to the vehicle control unit (VCU) 104. The VCU

104 controls motions (such as braking and deceleration) of the motor vehicles to implement various levels of automated driving functions. The in-vehicle computing apparatus 1201 may further upload data to a back-end cloud data center by using a T-BOX (telematics BOX) 103. Optionally, the in-vehicle computing apparatus 1201 may perform transmission with the camera 102 by using a multimedia serial link (MSL); perform transmission with the laser radar 105 by using an in-vehicle Ethernet link; perform transmission with the VCU 104 by using a controller area network (CAN) bus; perform transmission with the millimeter-wave radar 106 by using the CAN bus; and perform transmission with the T-BOX 103 by using the in-vehicle Ethernet link.

Figure 2:
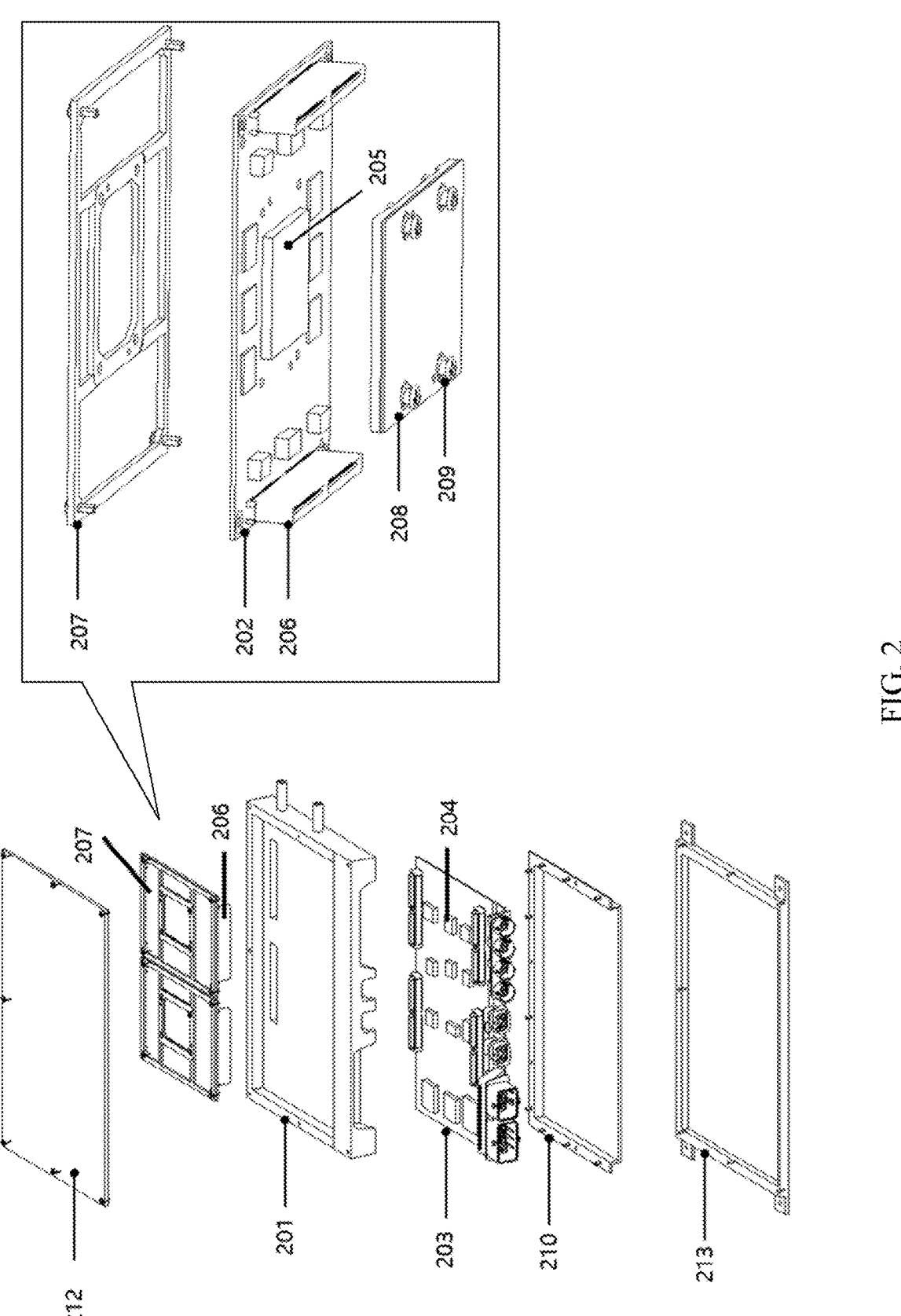
FIG. 2 is a schematic exploded view of a computing apparatus according to an embodiment of this application.

FIG. 2 is a schematic exploded view of an in-vehicle computing apparatus according to an embodiment of this application. The in-vehicle computing apparatus may be the in-vehicle computing apparatus described in FIG. 1 and related embodiments. It should be understood that, for ease of description, the in-vehicle computing apparatus in the following embodiments may also be referred to as a computing apparatus. As shown in FIG. 2, the in-vehicle computing apparatus provided in this embodiment of this application may include:

a mainboard 203, a heat dissipation component 201, and a target PCB 202, where a SOC 205 and a connection component 206 are disposed on the target PCB 202.

In this embodiment of this application, the mainboard 203 may also be referred to as a system mainboard. The mainboard 203 may be a rectangular circuit board, and a capacitor, a resistor, an inductor, a diode, a triode, a SOC, a peripheral circuit, or the like may be disposed on the mainboard 203. In an existing implementation, all components (including the SOC) in the computing apparatus are disposed on one mainboard. As an increasing quantity of components need to be disposed on the mainboard, an area of a required mainboard continuously increases. As a result, a size and a weight of a computing module increase, and different system mainboards need to be developed for computing apparatuses that require different computing power and different driving levels.

In this embodiment of this application, the SOC originally located on the mainboard is disposed on another PCB (referred to as the target PCB in this embodiment) independent of the mainboard. Specifically, in this embodiment of this application, the computing apparatus may include the target PCB 202. The target PCB 202 and the mainboard 203 are two independent PCBs, and the SOC 205 and the connection component 206 may be disposed on the target PCB 202. In addition, the target PCB 202 may be detachably connected to the heat dissipation component 201 in the computing apparatus by using the connection component 206.

In this embodiment, the heat dissipation component may be used as a detachably fastened object of the target PCB, that is, the target PCB may use the heat dissipation component as a mechanically fastened object, and is detachably installed on the heat dissipation component during installation. When the target PCB needs to be replaced, the target PCB may be removed from the heat dissipation component.

The following describes how the target PCB 202 is detachably connected to the heat dissipation component 201 by using the connection component 206.

In this embodiment, the connection component 206 may be a protrusion or a structure of another shape on the target PCB 202. A structure matching the connection component 206 may be disposed on the heat dissipation component 201. The connection component 206 may be detachably fastened to the structure that matches the connection component 206 and that is on the heat dissipation component 201, to detachably connect the target PCB to the heat dissipation component 201.

For example, the connection component 206 may be a protrusion part on the target PCB 202, the protrusion part may have a buckle, and the heat dissipation component 201 may have a fastening part corresponding to the protrusion part. During installation, the buckle on the protrusion part may be fastened to the fastening part on the heat dissipation component 201, and the buckle on the protrusion part may be removed from the fastening part on the heat dissipation component 201, to implement detachable connection between the target PCB 202 and the fastening part. In addition, the connection component 206 may alternatively be a harness, a flexible circuit board, or the like. This is not limited in this application.

It should be understood that during installation, the target PCB needs to be mechanically connected to the heat dissipation component. To implement signal transfer between a component on the target PCB and a component on the mainboard, electrical routes of the component on the target PCB and the component on the mainboard may be further configured. For example, in the foregoing embodiment, the connection component 206 is the protrusion part on the target PCB 202. The protrusion part may be a protrusion having a cavity, and an electrical route may be disposed in the cavity, the SOC 205 or another component on the target PCB 202 may be electrically connected to the component on the mainboard 203 by using the electrical route in the cavity.

In this embodiment of this application, if different SOCs need to be configured in the computing apparatus, there is no need to develop different system mainboards, and only a target PCB on which a required SOC is disposed needs to be selected and detachably installed on a heat dissipation component. On a premise that a system mainboard remains unchanged, only a target PCB on which a SOC of a different type or supplier is disposed needs to be replaced.

It should be understood that the target PCB in this embodiment may be detachably fastened to the heat dissipation component. As a structural basis for fastening the target PCB, the heat dissipation component may be fastened to an apparatus housing of the computing device; or the heat dissipation component may be connected to the mainboard, and the mainboard is fastened to the apparatus housing of the computing device; or both the heat dissipation component and the mainboard are fastened to the apparatus housing.

In this embodiment, the computing apparatus may include the apparatus housing. The apparatus housing may include a top cover 212 and a bottom cover 213. The top cover 212 and the bottom cover 213 are located outside the computing apparatus. The top cover 212 and the bottom cover 213 are connected to form a hollow area. The mainboard 203, the heat dissipation component 201, and the target PCB 202 are located in the hollow area. The apparatus housing may serve as a structural basis for fastening the mainboard 203, the heat dissipation component 201, and the target PCB 202. In an existing implementation, because a large quantity of components need to be disposed on the mainboard, the mainboard has a large area. Because the mainboard is usually rectangular plate-shaped, on a plane on which the mainboard is located, the existing mainboard occupies a large area. In this embodiment, the SOC is disposed on another target PCB independent of the mainboard, and the heat dissipation component is disposed between the mainboard and the target PCB 202. This is equivalent to disposing a part of the mainboard perpendicular to space in which the mainboard is located. In this manner, space occupied by the computing apparatus on the plane on which the mainboard is located is reduced.

In a possible implementation, the heat dissipation component 201 is located between the mainboard 203 and the target PCB 202, and a projection of the target PCB 202 along a normal direction of a plane on which the mainboard 203 is located overlaps with the mainboard 203.

In this embodiment of this application, the target PCB 202 including the SOC 205 is independently disposed. According to an arrangement rule of the target PCB 202, if the target PCB 202 is disposed on a same plane as the mainboard 203, areas occupied by the target PCB 202 and the mainboard 203 on the plane on which the mainboard 203 is located do not change greatly from an area occupied by the existing mainboard 203. If the target PCB 202 and the mainboard 203 are disposed on different planes, and a projection of the mainboard 203 along the normal direction of the plane on which the mainboard 203 is located partially or completely overlaps an area in which the target PCB 202 is located, in a direction of the plane on which the mainboard 203 is located, the areas occupied by the target PCB 202 and the mainboard 203 are less than the area occupied by the existing mainboard 203, that is, the target PCB 202 is arranged by using a size in a height direction (perpendicular to the plane on which the mainboard is located) inside the computing apparatus. Further, a projection of the target PCB 202 along the normal direction of the plane on which the mainboard 203 is located is in the area in which the mainboard 203 is located, so that an area occupied by the mainboard 203 along the normal direction of the plane on which the mainboard 203 is located is minimized.

In an implementation, an included angle between the plane on which the mainboard 203 is located and a plane on which the target PCB 202 is located is less than a preset value. The preset value may be an angle within 10 degrees. In this embodiment, in order to occupy less size in the height direction inside the computing apparatus, the included angle between the plane on which the mainboard 203 is located and the plane on which the target PCB 202 is located may be set to be close to 0, that is, the mainboard 203 and the target PCB 202 are disposed in parallel or nearly parallel, to reduce occupied space along a direction of the plane on which the mainboard is located, and further reduce occupied space along a vertical direction of the mainboard 203.

In addition, in this embodiment of this application, to dissipate heat from the heat emitting device on the target PCB and/or the mainboard, the heat dissipation component may be disposed between the mainboard and the target PCB, and the heat emitting device on the target PCB and/or the mainboard may be attached to the heat dissipation component. For example, heat generated by the heat emitting device on the target PCB and/or the mainboard is transferred to the heat dissipation component through direct contact or through a thermal conductive medium.

In an implementation, a surface that is of the target PCB 202 and on which the SOC 205 is disposed faces the heat dissipation component 201, so that heat generated by the SOC 205 can be transferred to the heat dissipation component 201.

In a possible implementation, the SOC 205 may transfer generated heat to the heat dissipation component 201 by using a thermal conductive medium. The heat dissipation component 201 may be a liquid cold plate, and a liquid cooling pipe is disposed in an area that is on the liquid cold plate and that faces the SOC 205. For example, a water inlet and a water outlet may be disposed on the liquid cold plate, and form a complete liquid cooling system with a liquid cooling kit on a vehicle, to implement heat dissipation of the entire system. The heat dissipation component 201 may alternatively be an air-cooled radiator. The SOC 205 is located in an air-cooled heat dissipation area of the air-cooled radiator. The SOC 205 may transfer generated heat to the air-cooled heat dissipation area of the air-cooled radiator by using a thermal conductive medium.

In a possible implementation, a first temperature equalizing plate 208 is disposed between the SOC 205 and the heat dissipation component 201, and a thermal conductive material is filled between the first temperature equalizing plate 208 and the SOC 205. The first temperature equalizing plate 208 may be fastened to the target PCB 202 by using a screw or in another manner. In this embodiment of this application, the first temperature equalizing plate 208 may be a vapor chamber (VC) heat equalizing radiator, and the thermal conductive material may be but is not limited to thermal conductive silicone grease. Thermal conductive silicone grease is filled between the heat dissipation component 201 and the SOC 205, so that a heat dissipation area of the SOC 205 can be expanded, and contact thermal resistance for heat dissipation of the SOC 205 can be reduced.

In an implementation, one side of the first temperature equalizing plate 208 may be fastened to the target PCB 202 by using a screw or in another manner, and the other side of the first temperature equalizing plate 208 may be connected to the heat dissipation component 201 in a floating manner by using a spring screw 209.

It should be understood that the SOC 205 may alternatively transfer heat to the heat dissipation component 201 by using another intermediate thermal conductive medium. This is not limited in this embodiment of this application.

In a possible implementation, a fixing plate 207 is attached to a surface that is of the target PCB 202 and that faces away from the heat dissipation component 201. The fixing plate 207 may be configured to enhance strength of the target PCB 202, to ensure that the target PCB 202 is not deformed in a process of inserting or removing the target PCB 202. Refer to FIG. 2. The fixing plate 207 may be a backplane support, and the backplane support may be fastened, by using a screw or the like, to a surface that is of the target PCB and that faces away from the heat dissipation component 201.

Figure 3:
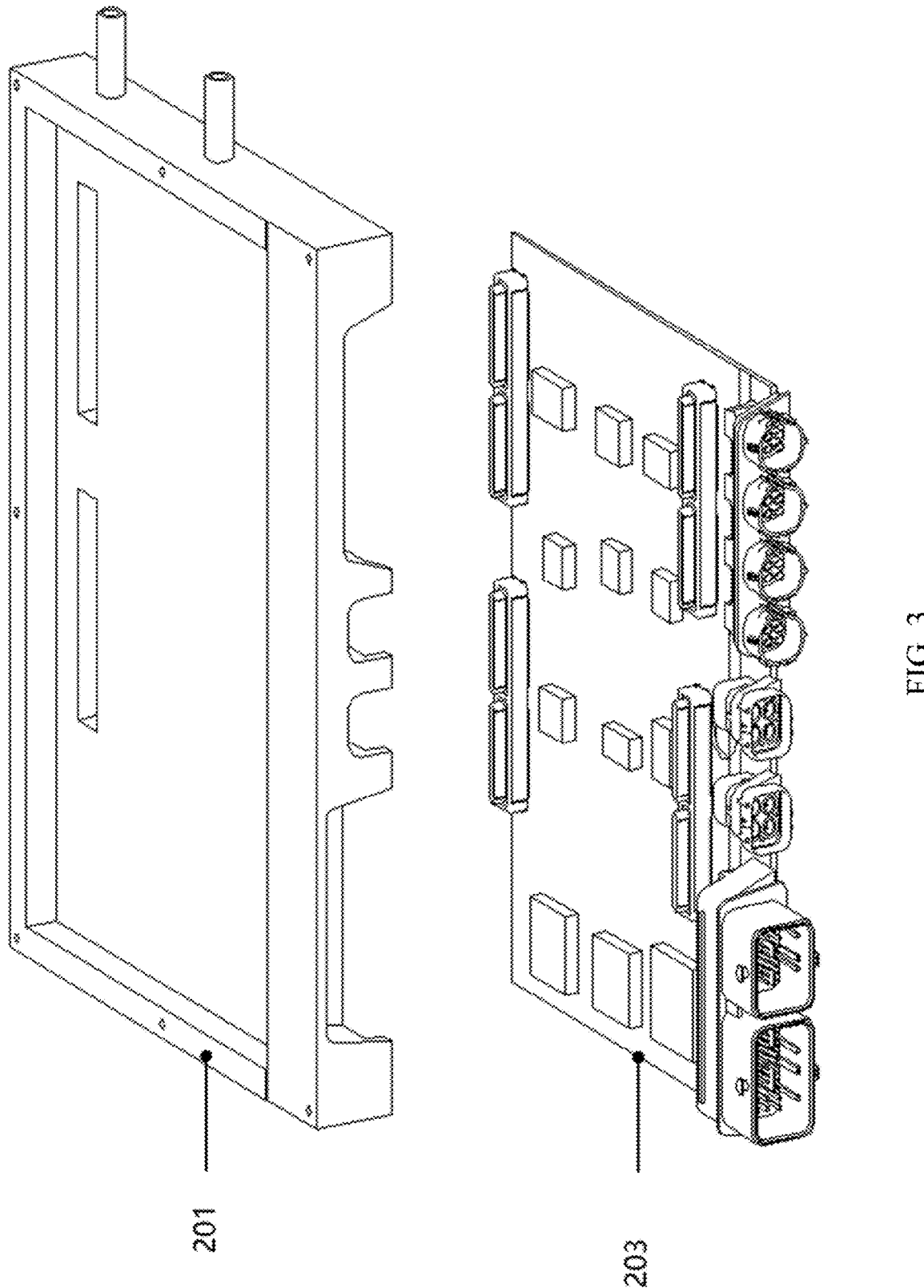
FIG. 3 is a schematic exploded view of a computing apparatus according to an embodiment of this application.

In an implementation, one side of the mainboard 203 may be fastened to the heat dissipation component 201. As shown in FIG. 3, one side of the mainboard 203 may be fastened to the heat dissipation component 201, a heat emitting device 211 on one side of the mainboard 203 may be closely attached to the heat dissipation component 201, heat generated by the heat emitting device 211 may be conducted to the heat dissipation component 201, and the heat dissipation component 201 takes away the heat.

In a possible implementation, the heat emitting device 211 is disposed on a side that is of the mainboard 203 and that faces away from the heat dissipation component 201, a second temperature equalizing plate 210 is attached to the heat emitting device 211, and an edge of the second temperature equalizing plate 210 is connected to the heat dissipation component 201, so that heat generated by the heat emitting device 211 can be transferred to the heat dissipation component 201 by using the second temperature equalizing plate 210.

In an existing implementation, heat is dissipated between a back-side component on the mainboard 203 and an inner surface of a lower housing of the computing apparatus by using a thermal conductive material, and heat is mainly dissipated by natural convection between the lower housing and an external environment, which has limited heat dissipation capability. Therefore, only a low-power component can be deployed. In addition, the component runs in a high-temperature environment for long time, and a long-term reliability life of the component is low. In this embodiment, the second temperature equalizing plate 210 is attached to the heat emitting device 211 arranged on the back side of the mainboard 203, and the edge of the second temperature equalizing plate 210 is connected to the heat dissipation component 201, so that heat generated by the heat emitting device 211 can be transferred to the heat dissipation component 201 by using the second temperature equalizing plate 210. In this embodiment of this application, the second temperature equalizing plate 210 may be fastened to the heat dissipation component 201. All heat emitting devices 211 on the back side of the mainboard 203 are closely attached to the second temperature equalizing plate 210, and generated heat is conducted to the second temperature equalizing plate 210. The second temperature equalizing plate 210 may be securely connected to the heat dissipation component 201 by using a screw or in another connection manner. In the foregoing manner, heat on the second temperature equalizing plate 210 may be transferred to the heat dissipation component 201. In an optional implementation, a thermal conductive material may be filled between the heat emitting device 211 and the second temperature equalizing plate 210.

For example, refer to FIG. 2. The second temperature equalizing plate 210 may be a cover-like structure with a protrusion at an edge. When the second temperature equalizing plate 210 is installed on the heat dissipation component 201, the protrusion of the second temperature equalizing plate 210 may be fastened to the heat dissipation component 201, and the mainboard 203 is disposed between the heat dissipation component 201 and the second temperature equalizing plate 210. For more details, refer to FIG. 4. The mainboard 203 may be attached to one side of the heat dissipation component 201, and a specific gap is reserved on an edge side of the heat dissipation component 201. The edge protrusion of the second temperature equalizing plate 210 may be fastened to the gap reserved on the edge side of the heat dissipation component 201. For example, the edge protrusion of the second temperature equalizing plate 210 may be fastened to the gap reserved on the edge side of the heat dissipation component 201 by using a fastening screw 214. After fastening is completed, a surface that is of the second temperature equalizing plate 210 and that faces the mainboard 203 is attached to the heat emitting device 211 disposed on the mainboard 203 (as shown in FIG. 5).

Figures 6, 7A:
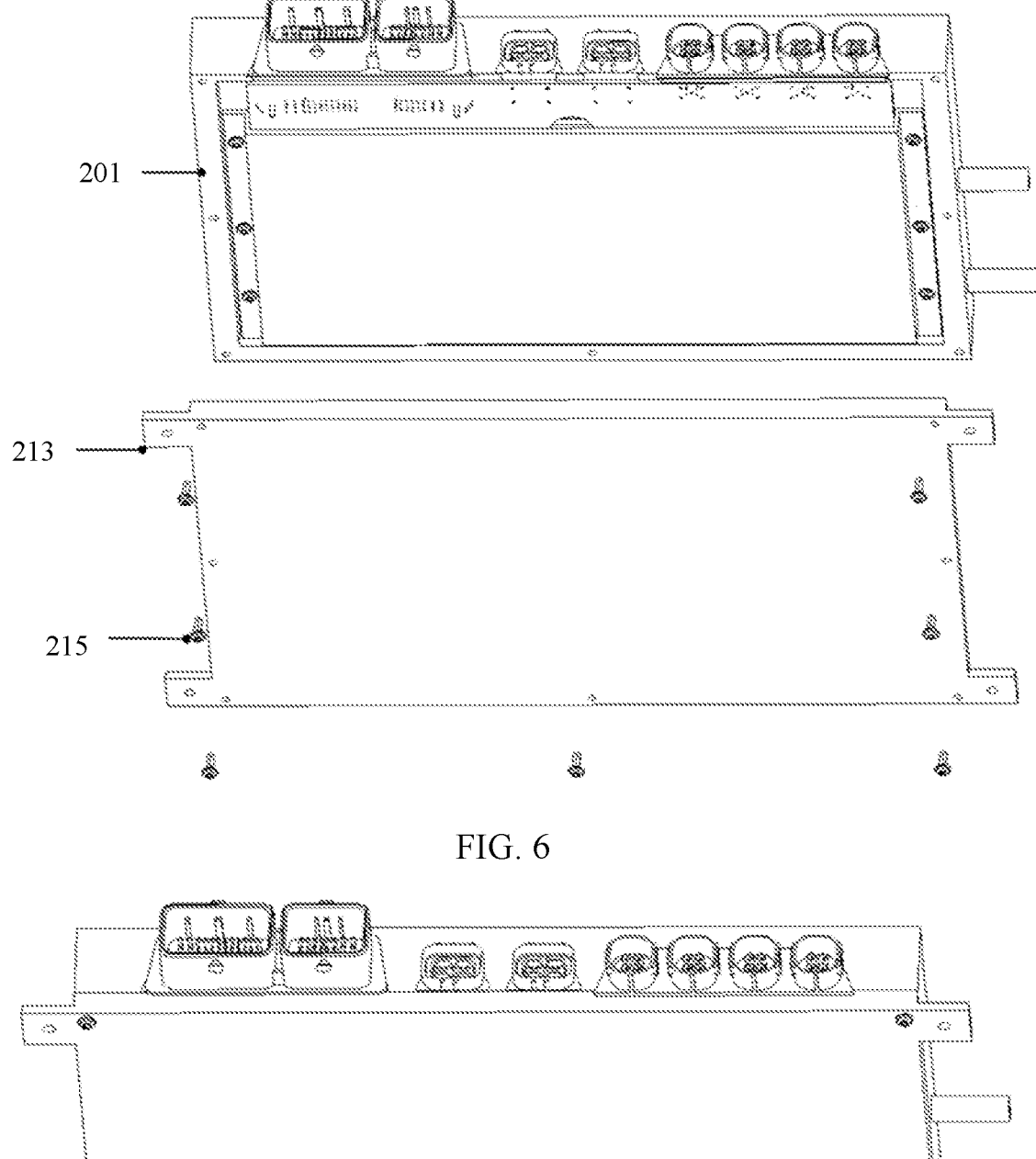
FIG. 6 is a schematic exploded view of a computing apparatus according to an embodiment of this application.
FIG. 7*a* is a schematic exploded view of a computing apparatus according to an embodiment of this application.

In addition, to prevent external dust and water from entering the mainboard 203 and the target PCB 202, the top cover 212 and the bottom cover 213 may be fastened to the heat dissipation component 201. The second temperature equalizing plate 210 and the mainboard 203 are disposed between the bottom cover 213 and the heat dissipation component 201, and the target PCB 202 is disposed between the top cover 212 and the heat dissipation component 201, to seal the internal mainboard 203 and the target PCB 202. For example, refer to FIG. 6. The bottom cover 213 may be fastened to the heat dissipation component 201. FIG. 7a shows a schematic diagram of a structure after the bottom cover 213 is fastened to the heat dissipation component 201.

Figure 7B:
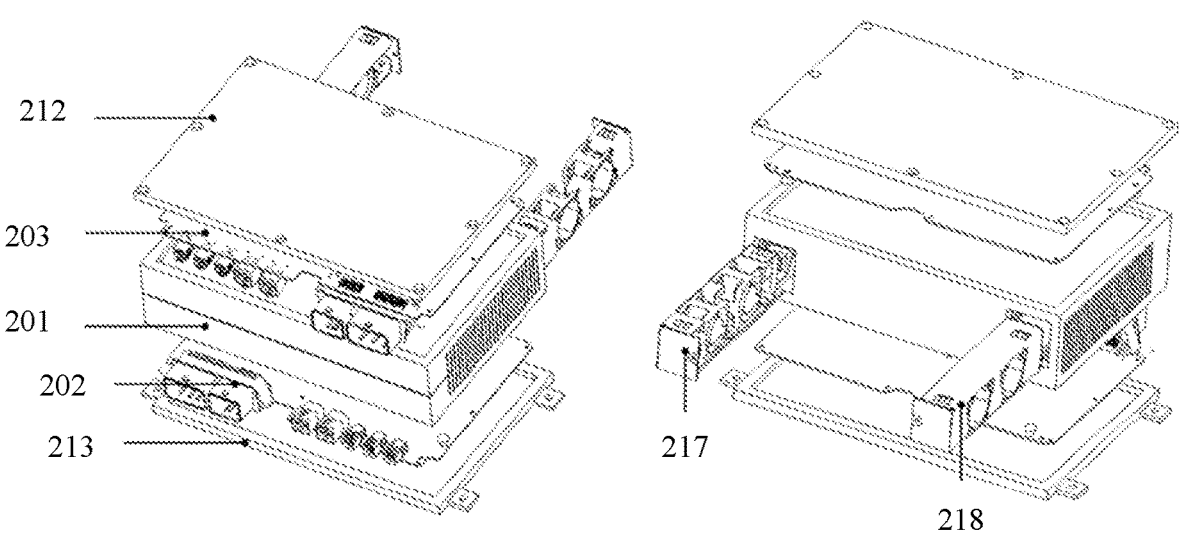
FIG. 7*b* is a schematic exploded view of a computing apparatus according to an embodiment of this application.

In this embodiment of this application, if power consumption of the heat emitting device 211 on the mainboard 203 and the target PCB 202 is high, the heat dissipation component 201 may be a liquid cold plate; or if power consumption of the heat emitting device 211 on the mainboard 203 and the target PCB 202 is low, the heat dissipation component 201 may be an air-cooled radiator. For example, refer to FIG. 7b. The air-cooled radiator may include a fan module 217 and a fan module 218, and there may be an air-cooled heat dissipation area between the fan module 217 and the fan module 218.

The following describes a schematic diagram of an assembly procedure of an in-vehicle computing apparatus by using an example in which a heat dissipation component is a liquid cold plate.

Refer to FIG. 3. First, the mainboard 203 may be fastened to the liquid cold plate, so that a heat emitting device on a front side of the mainboard 203 is closely attached to a rear side of the liquid cold plate, heat generated by the heat emitting device may be conducted to the liquid cold plate, and the heat is brought to the outside through liquid circulation.

Figure 4:
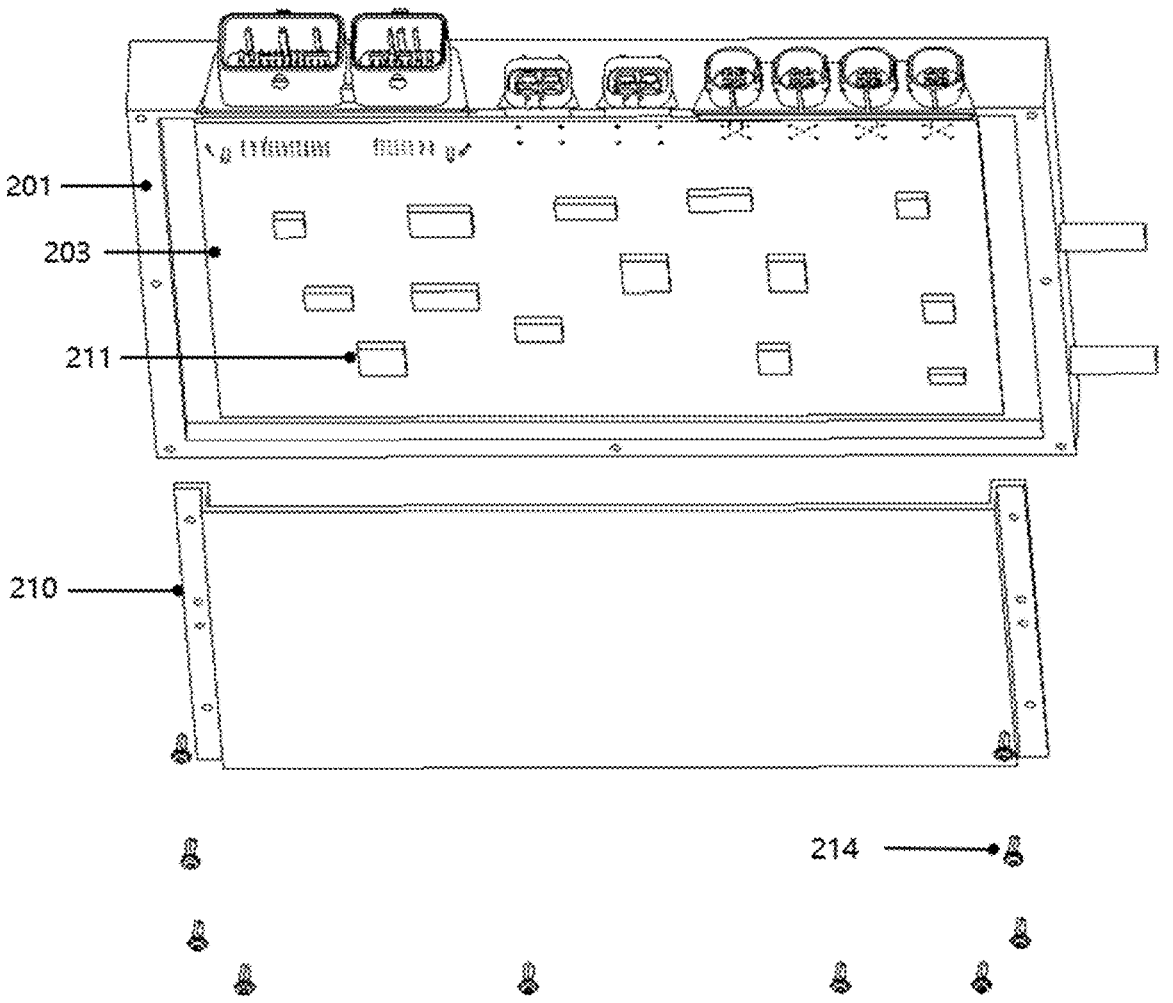
FIG. 4 is a schematic exploded view of a computing apparatus according to an embodiment of this application.
Figure 5:
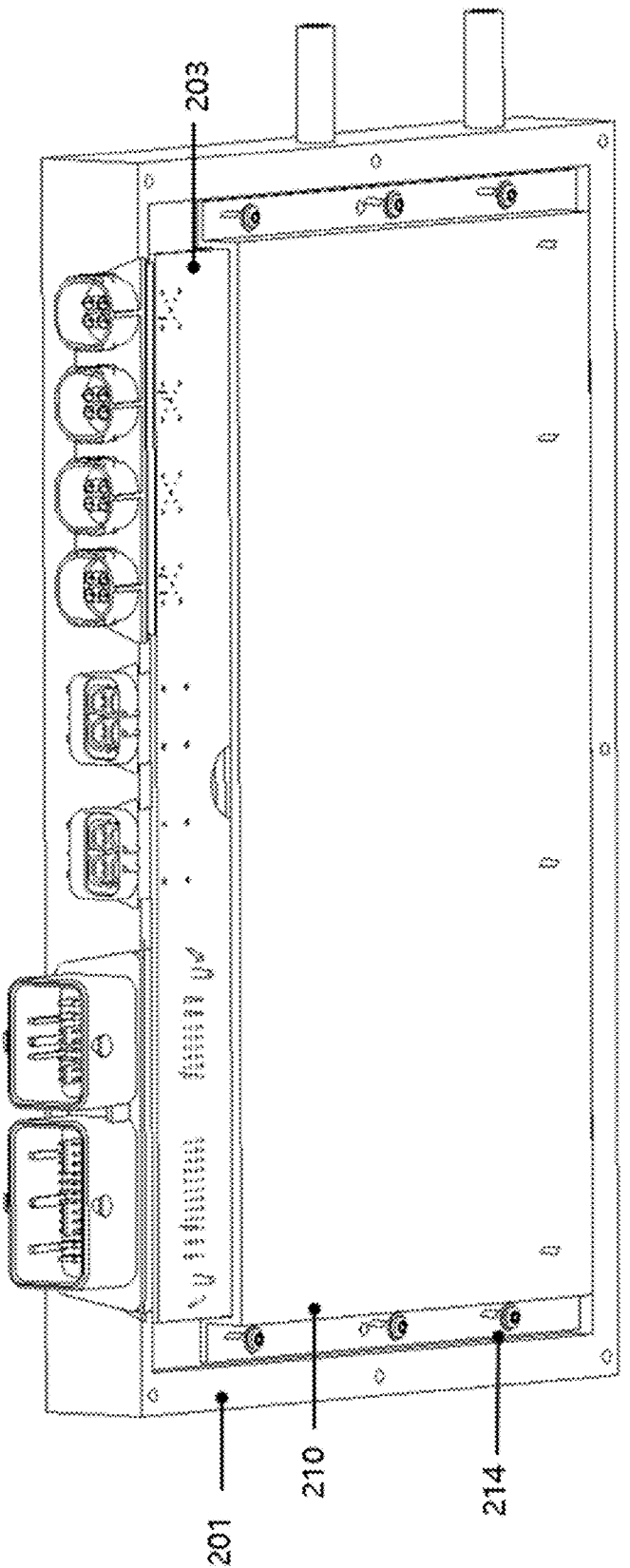
FIG. 5 is a schematic exploded view of a computing apparatus according to an embodiment of this application.

Refer to FIG. 4. The second temperature equalizing plate may be fastened to the liquid cold plate. A heat emitting device on the back side of the mainboard 203 is closely attached to the second temperature equalizing plate. Heat generated by the heat emitting device on the back side of the mainboard 203 is conducted to the second temperature equalizing plate. Thermal conductive silicone grease may be filled between the second temperature equalizing plate and the liquid cold plate, and the second temperature equalizing plate and the liquid cold plate are securely connected by using screws. Heat on the second temperature equalizing plate may be transferred to the liquid cold plate, and then the liquid cold plate circulates heat to the outside. A schematic diagram obtained after the second temperature equalizing plate is assembled with the liquid cold plate may be shown in FIG. 5.

Refer to FIG. 6. Then, the bottom cover may be fastened to the liquid cold plate, to seal the internal system mainboard 203, and prevent external dust and water from entering the system mainboard 203. A schematic diagram obtained after the bottom cover is assembled with the liquid cold plate may be shown in FIG. 7a.

Figure 8:
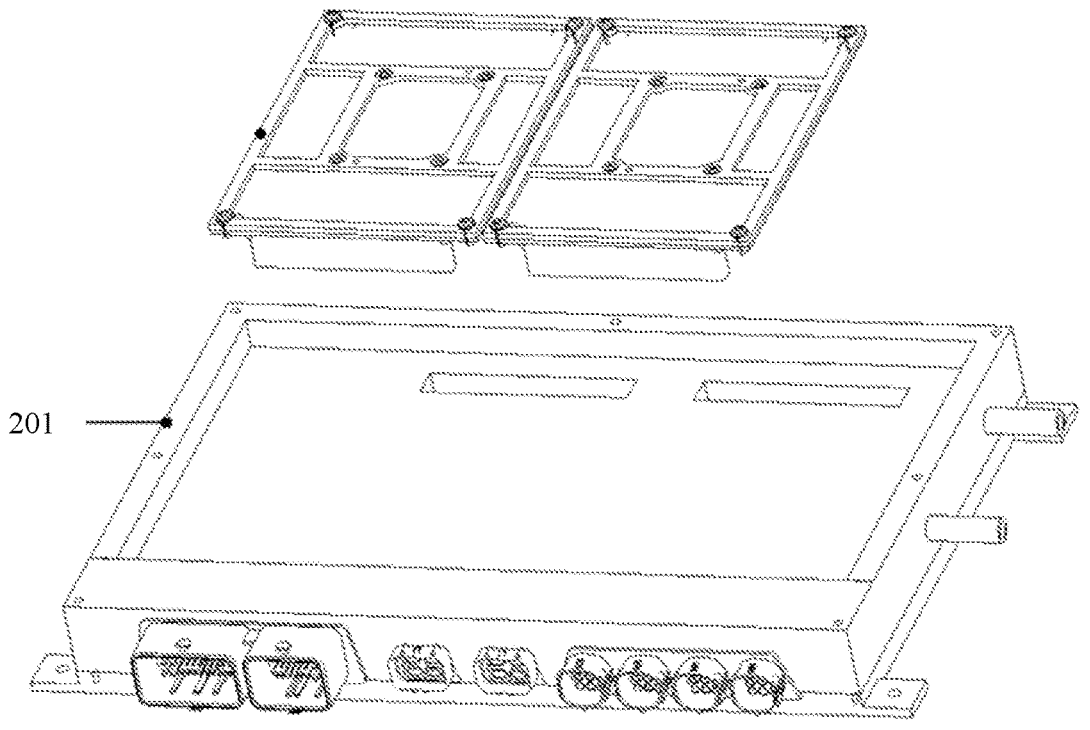
FIG. 8 is a schematic exploded view of a computing apparatus according to an embodiment of this application.
Figure 9:
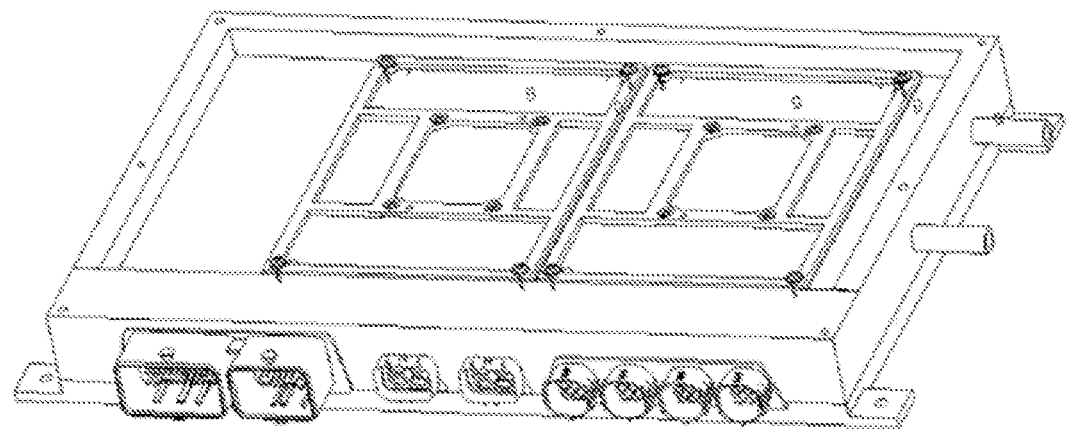
FIG. 9 is a schematic exploded view of a computing apparatus according to an embodiment of this application.
Figure 10:
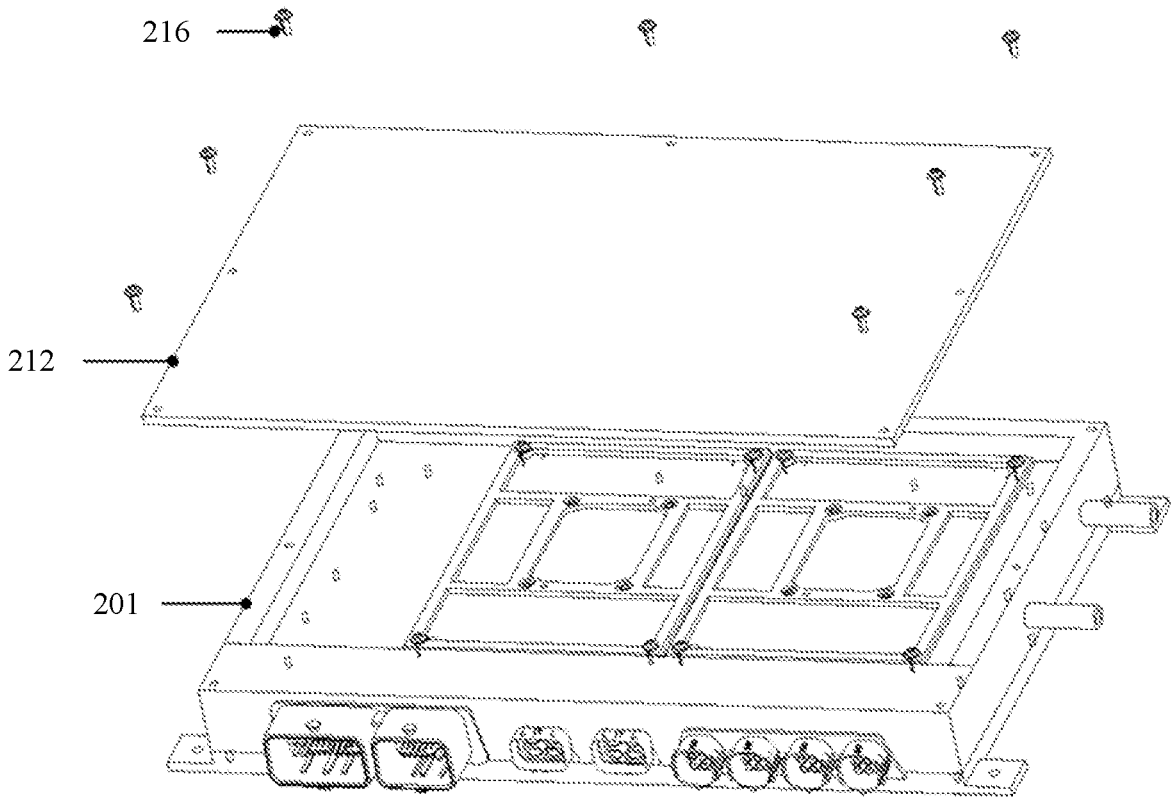
FIG. 10 is a schematic exploded view of a computing apparatus according to an embodiment of this application.

Refer to FIG. 8. Then, a SOC daughter card module (including the target PCB 202) may be fastened to the liquid cold plate. Specifically, the SOC daughter card module may be connected to the liquid cold plate by using a connection component. A schematic diagram of an assembled in-vehicle computing apparatus may be shown in FIG. 10.

Figure 11:
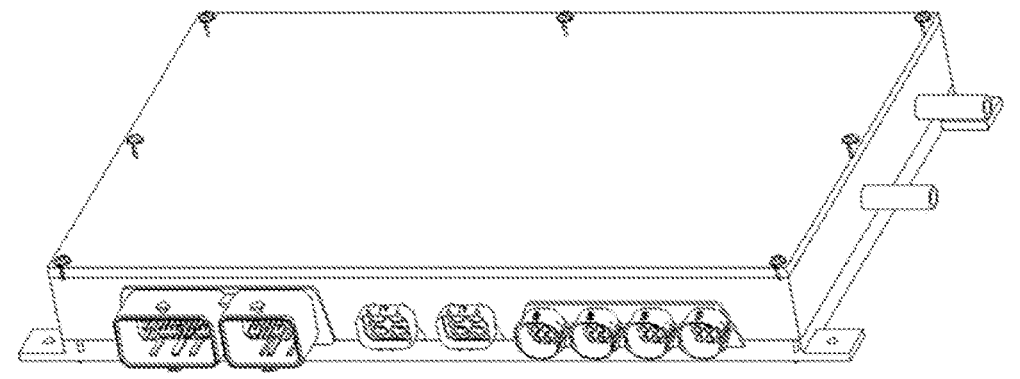
FIG. 11 is a schematic exploded view of a computing apparatus according to an embodiment of this application.

Refer to FIG. 11. Then, the upper cover may be fastened to the liquid cold plate, to seal the internal system mainboard 203, and prevent external dust and water from entering the system mainboard 203. A schematic diagram after assembly may be shown in FIG. 11.

An embodiment of this application provides an in-vehicle computing apparatus, including a mainboard, a heat dissipation component, and a target PCB. A system on chip SOC and a connection component are disposed on the target PCB. A side of the mainboard is attached to the heat dissipation component. The target PCB is located on a side that is of the heat dissipation component and that faces away from the mainboard, and is detachably connected to the heat dissipation component by using the connection component. In this embodiment of this application, the computing apparatus may include the target PCB. The target PCB and the mainboard are two independent PCBs, and the SOC and the connection component may be disposed on the target PCB. In addition, the target PCB may be detachably connected to a fixing component in the computing apparatus by using the connection component. If different SOCs need to be configured in the in-vehicle computing apparatus, there is no need to develop different system mainboards, and only a target PCB on which a required SOC is disposed needs to be selected and detachably installed on the heat dissipation component. On a premise that a system mainboard remains unchanged, only a target PCB on which a SOC of a different type or supplier is disposed needs to be replaced.

Figure 12:
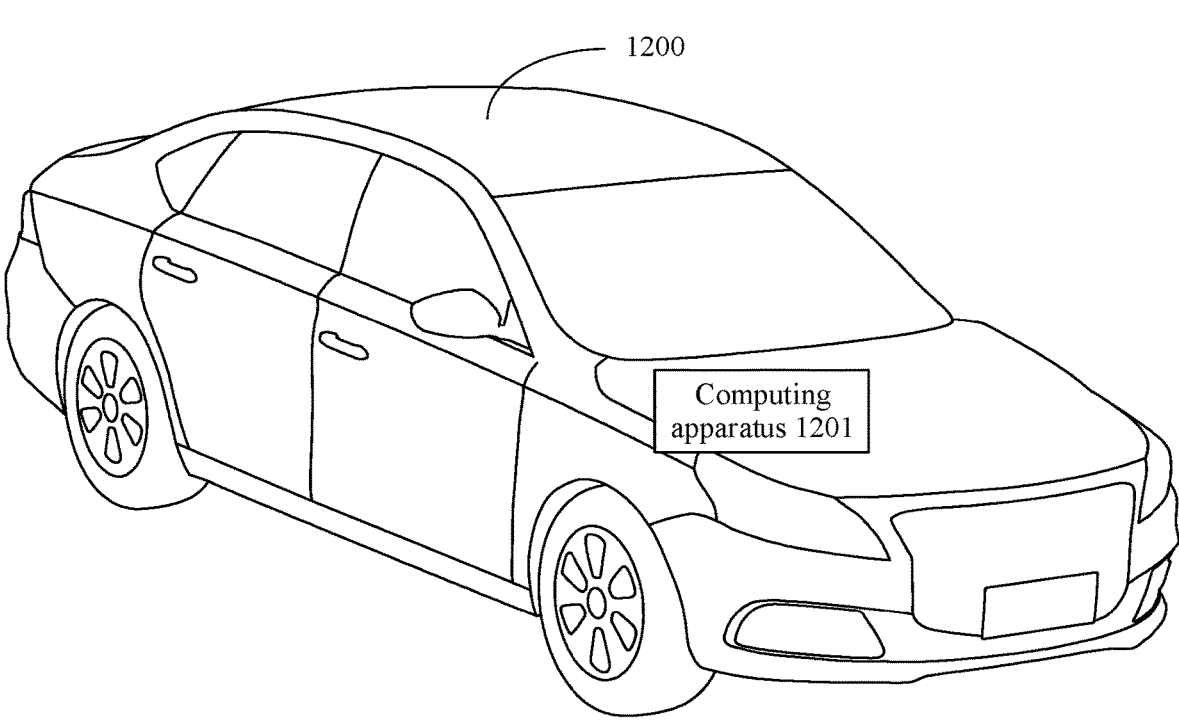
FIG. 12 is a schematic diagram of a structure of a vehicle according to an embodiment of this application.

FIG. 12 is a schematic diagram of a vehicle according to this application. As shown in the figure, the vehicle includes a vehicle body 1200 and an in-vehicle computing apparatus 1201 disposed on a device body. The in-vehicle computing apparatus 1201 may be the in-vehicle computing apparatus described in any embodiment described in FIG. 2 to FIG. 11. The in-vehicle computing apparatus may be located in a vehicle head or a vehicle body of the vehicle. This is not limited in this application.

In a possible embodiment, in addition to the vehicle shown in FIG. 11, this embodiment of this application may be further applied to another type of system, for example, an edge station device, a server, or a storage device. During specific implementation, reference may be made to structural features of the computing device mentioned in FIG. 2 to FIG. 11 in the foregoing embodiments.

In addition, it should be noted that the described apparatus embodiment is merely an example. The units described as separate parts may or may not be physically separate, and parts displayed as units may or may not be physical units, may be located in one position, or may be distributed on a plurality of network units. Some or all the modules may be selected based on actual needs to achieve the objectives of the solutions of embodiments. In addition, in the accompanying drawings of the apparatus embodiments provided in this application, connection relationships between modules indicate that the modules have communication connections with each other, which may be specifically implemented as one or more communication buses or signal cables.

Based on the description of the foregoing implementations, a person skilled in the art may clearly understand that this application may be implemented by software in addition to necessary universal hardware, or by dedicated hardware, including a dedicated integrated circuit, a dedicated CPU, a dedicated memory, a dedicated component, and the like. Generally, any functions that can be performed by a computer program can be easily implemented by using corresponding hardware. Moreover, a specific hardware structure used to achieve a same function may be in various forms, for example, in a form of an analog circuit, a digital circuit, or a dedicated circuit. However, as for this application, software program implementation is a better implementation in most cases. Based on such an understanding, the technical solutions of this application essentially or the part contributing to the conventional technology may be implemented in a form of a software product. The computer software product is stored in a readable storage medium, such as a floppy disk, a USB flash drive, a removable hard disk, a ROM, a RAM, a magnetic disk, or an optical disc of a computer, and includes several instructions for instructing a computer device (which may be a personal computer, a training device, or a network device) to perform the methods in embodiments of this application.

All or some of the foregoing embodiments may be implemented by using software, hardware, firmware, or any combination thereof. When software is used to implement the embodiments, all or a part of the embodiments may be implemented in a form of a computer program product.

The computer program product includes one or more computer instructions. When the computer program instructions are loaded and executed on the computer, the procedure or functions according to embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, training device, or data center to another website, computer, training device, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a training device or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

What is claimed is:

1. An in-vehicle computing apparatus, comprising:
a heat dissipation component, wherein the heat dissipation component comprises a liquid cold plate, wherein the liquid cold plate comprises a first side, a second side and a third side, wherein the first side is opposite to the second side, wherein the liquid cold plate comprises at least one hole, the at least one hole penetrates through the first side and the second side, and the at least one hole avoids liquid cooling pipelines comprised in the liquid cold plate, and wherein the liquid cold plate comprises an inlet and an outlet which are disposed on the third side of the liquid cold plate and are connected to the liquid cooling pipelines;
a mainboard, wherein the mainboard is fastened to the first side of the liquid cold plate; and
a target printed circuit board (PCB) comprising a system on chip (SOC), wherein the target PCB is located on the second side of the liquid cold plate facing away from the mainboard, and wherein the SOC is disposed on a surface of the target PCB facing the liquid cold plate;
wherein the target PCB comprises a protrusion part disposed on the target PCB, the target PCB is electrically connected to the mainboard via the protrusion part, and the protrusion part passes through the at least one hole.

2. The in-vehicle computing apparatus according to claim 1, wherein the target PCB has a projection along a normal direction of a plane on which the mainboard is located, and the projection partially or completely overlaps an area in which the mainboard is located.

3. The in-vehicle computing apparatus according to claim 2, wherein the projection of the target PCB is in the area in which the mainboard is located.

4. The in-vehicle computing apparatus according to claim 1, wherein a plane on which the mainboard is located and a plane on which the target PCB is located are parallel.

5. The in-vehicle computing apparatus according to claim 1, further comprising:
a first temperature equalizing plate disposed between the SOC and the heat dissipation component, wherein the SOC is attached to the first temperature equalizing plate.

6. The in-vehicle computing apparatus according to claim 5, further comprising:

a thermal conductive material filled between the first temperature equalizing plate and the SOC.

7. The in-vehicle computing apparatus according to claim 5, wherein the mainboard comprises a heat emitting device disposed on a side of the mainboard facing away from the heat dissipation component; and wherein the in-vehicle computing apparatus further comprises a second temperature equalizing plate attached to the heat emitting device and connected to the heat dissipation component.

8. The in-vehicle computing apparatus according to claim 7, further comprising:

a thermal conductive material filled between the heat emitting device and the second temperature equalizing plate.

9. The in-vehicle computing apparatus according to claim 1, further comprising:

an apparatus housing, wherein the heat dissipation component is fastened to the apparatus housing.

10. The in-vehicle computing apparatus according to claim 9, further comprising:

a fixing plate attached to a surface of the target PCB facing away from the heat dissipation component.

11. A vehicle, comprising:

a vehicle body; and an in-vehicle computing apparatus disposed in the vehicle body, wherein the in-vehicle computing apparatus comprises:

a heat dissipation component, wherein the heat dissipation component comprises a liquid cold plate, wherein the liquid cold plate comprises a first side, a second side and a third side, wherein the first side is opposite to the second side, wherein the liquid cold plate comprises at least one hole, the at least one hole penetrates through the first side and the second side, and the at least one hole avoids liquid cooling pipelines comprised in the liquid cold plate, and wherein the liquid cold plate comprises an inlet and an outlet which are disposed on the third side of the liquid cold plate and are connected to the liquid cooling pipelines;

a mainboard, wherein the mainboard is fastened to the first side of the liquid cold plate; and a target printed circuit board (PCB), and the target PCB comprises a system on chip (SOC), wherein the target PCB is located on the second side of the liquid cold plate facing away from the mainboard, and wherein the SOC is disposed on a surface of the target PCB facing the liquid cold plate-;

wherein the target PCB comprises a protrusion part disposed on the target PCB, the target PCB is electrically connected to the mainboard via the protrusion part, and the protrusion part passes through the at least one hole.

12. The vehicle according to claim 11, wherein the target PCB has a projection along a normal direction of a plane on which the mainboard is located, and the projection partially or completely overlaps an area in which the mainboard is located.

13. The vehicle according to claim 12, wherein the projection of the target PCB is in the area in which the mainboard is located.

14. The vehicle according to claim 11, wherein a plane on which the mainboard is located and a plane on which the target PCB is located are parallel.

15. The vehicle according to claim 11, wherein the in-vehicle computing apparatus further comprises:

a first temperature equalizing plate disposed between the SOC and the heat dissipation component, wherein the SOC is attached to the first temperature equalizing plate.

16. The vehicle according to claim 15, wherein the in-vehicle computing apparatus further comprises:

a thermal conductive material filled between the first temperature equalizing plate and the SOC.

17. The vehicle according to claim 11, wherein the in-vehicle computing apparatus further comprises:

an apparatus housing, wherein the heat dissipation component is fastened to the apparatus housing.

18. The vehicle according to claim 17, wherein the in-vehicle computing apparatus further comprises:

a fixing plate attached to a surface of the target PCB facing away from the heat dissipation component.

19. The vehicle according to claim 11, wherein the mainboard comprises a heat emitting device disposed on a side of the mainboard facing away from the heat dissipation component; and wherein the in-vehicle computing apparatus further comprises a second temperature equalizing plate attached to the heat emitting device and connected to the heat dissipation component.

20. The vehicle according to claim 19, wherein the in-vehicle computing apparatus further comprises:

a thermal conductive material filled between the heat emitting device and the second temperature equalizing plate.

* * * * *